United States Patent [19]
Engelbrecht

[11] Patent Number: 5,193,972
[45] Date of Patent: Mar. 16, 1993

[54] WAFER HANDLING SYSTEM
[75] Inventor: Orest Engelbrecht, Ridgefield, Conn.
[73] Assignee: SVG Lithography Systems, Inc., Wilton, Conn.
[21] Appl. No.: 790,427
[22] Filed: Nov. 12, 1991

Related U.S. Application Data

[62] Division of Ser. No. 577,209, Sep. 4, 1990, Pat. No. 5,085,558, which is a division of Ser. No. 351,741, Apr. 17, 1989, Pat. No. 4,973,217, which is a division of Ser. No. 12,538, Feb. 9, 1987, Pat. No. 4,846,626.

[51] Int. Cl.[5] .............................................. B65G 47/24
[52] U.S. Cl. .................................. 414/754; 414/737; 414/225; 414/416; 414/752
[58] Field of Search ............... 414/786, 331, 416, 417, 414/222, 225, 754, 752, 627, 744.8, 751, 744.2, 737, 728; 901/27, 46, 47; 118/729, 719, 500; 364/474.14, 559

[56] References Cited

U.S. PATENT DOCUMENTS

| | | | |
|---|---|---|---|
| 4,328,553 | 5/1982 | Fredriksen | 364/474.14 X |
| 4,402,613 | 9/1983 | Daly et al. | 414/416 X |
| 4,407,627 | 10/1983 | Sato et al. | 414/754 X |
| 4,425,075 | 1/1984 | Quinn | 414/755 |
| 4,457,664 | 7/1984 | Judell et al. | 414/779 |
| 4,539,695 | 9/1985 | La Flandra | 414/222 X |
| 4,566,726 | 1/1986 | Corventi et al. | 414/752 X |
| 4,775,281 | 10/1988 | Prentakis | 414/754 X |
| 4,818,169 | 4/1989 | Schram | 414/416 X |

FOREIGN PATENT DOCUMENTS 0053703 3/1983 Japan.

OTHER PUBLICATIONS

Semiconductor Production Publication–Autumn, 1980–pp. 31-33.

Primary Examiner—Frank E. Werner
Attorney, Agent, or Firm—Paul A. Fattibene; Arthur T. Fattibene

[57] ABSTRACT

This invention relates to apparatus for prealigning the transport stage of an automated wafer handling lithographic system. The wafer is first rotated and its displacement in X, Y, and $\Theta$ from a desired orientation is determined. The wafer chuck of the transport stage is then displaced by a compensating amount.

4 Claims, 3 Drawing Sheets

WAFER HANDLING SYSTEM

This application is a division of application Ser. No. 07/577,209 filed Sep. 4, 1990 now U.S. Pat. No. 5,085,558 which is a division of application Ser. No. 07/351,741, filed Apr. 17, 1989, now U.S. Pat. No. 4,973,217 which is a division of application Ser. No. 07/012,538 filed Feb. 9, 1987 now U.S. Pat. No. 4,846,626.

TECHNICAL FIELD

This invention pertains to the automatic handling of semiconductor wafers in a lithographic process.

BACKGROUND ART

Conventionally, semiconductor wafers are coated with photoresist material and exposed to radiation from a mercury lamp in order to apply electrical circuits thereon. This process is repeated a number of times, typically in a projection mask alignment and exposure system. It is extremely important that a wafer be precisely oriented for each exposure in order to insure correct registration of each successive image. The usual methods of transporting a wafer within such a system have been by means of belts and air tracks. However, these methods have not provided sufficiently positive control. As a result, wafers have tended to slide and bounce, thereby generating particles which, upon landing on the wafer, could damage the micro circuits being printed.

Accordingly, it is an object of this invention to increase the control exercised over each wafer while, at the same time, precisely aligning each wafer with a minimum of handling. The manner in which this is achieved will be apparent from the following description and appended claims.

DISCLOSURE OF INVENTION

A randomly oriented semiconductor wafer contained in an input cassette is automatically removed from the cassette and, in one revolution, is characterized in X, Y, and $\Theta$ with respect to a spin axis. It is rotated to a predetermined $\Theta$ position and is transferred onto a transport stage that has been pre-positioned in X and Y, in accordance with the offsets determined during rotation.

BEST MODE FOR CARRYING OUT THE INVENTION

Figures 1, 2:
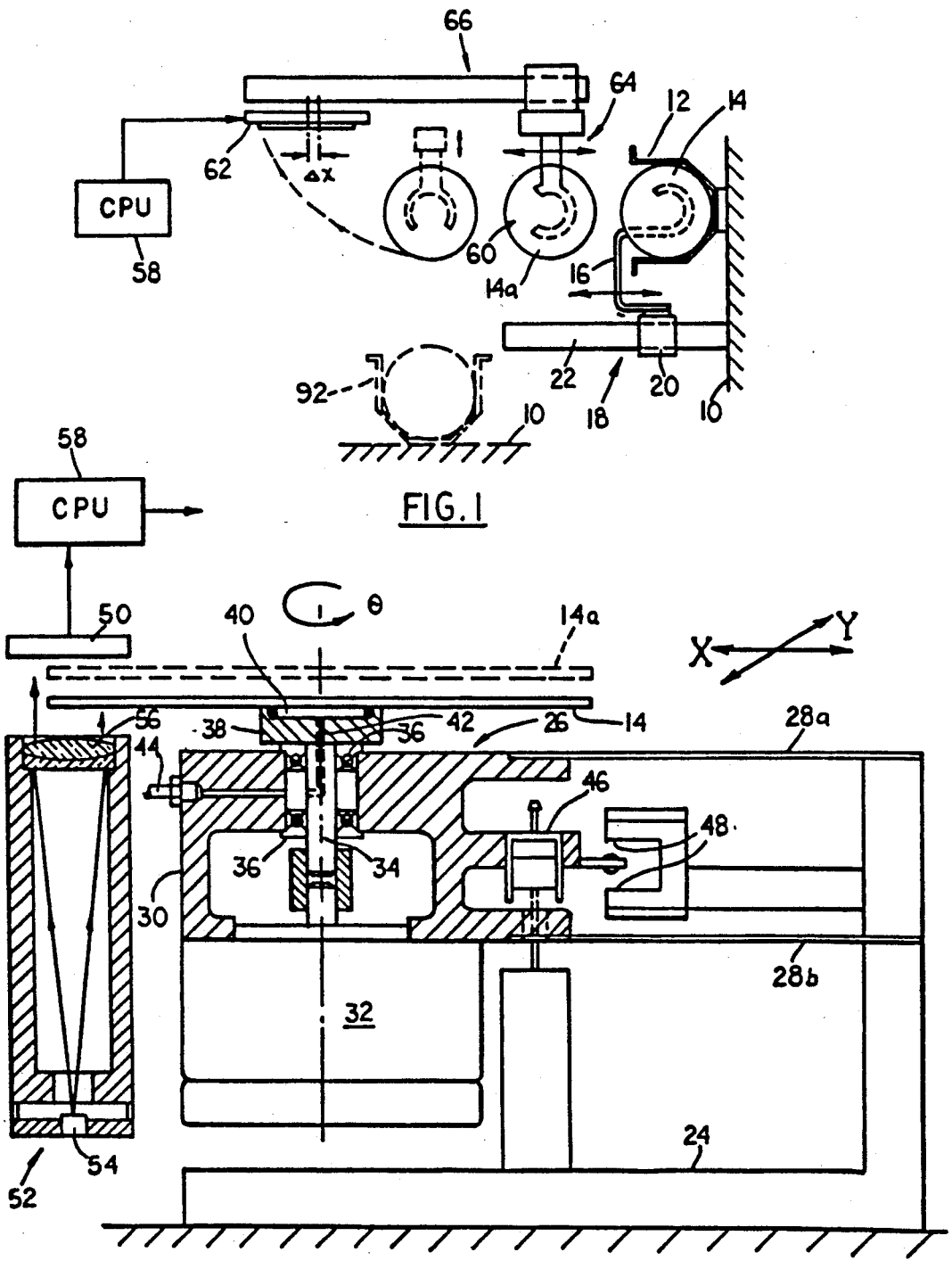
FIG. 1 is a partially schematic plan view which illustrates the movement of a wafer in accordance with the invention.
FIG. 2 is an elevational cross-section through the pre-aligner of the invention.

Illustrated in FIG. 1 are portions of the structure 10 of an automated lithographic instrument for the production of semiconductor wafers. An input cassette 12 of conventional construction holds a plurality of wafers 14 in random orientation. As will be apparent from the plan view of FIG. 1, the wafers 14 within the cassette 12 are horizontally positioned. The cassette 12 is lowered by means of a lead screw (not shown) in fixed increments to successively deposit each of the wafers 14 onto a load shuttle 16. The load shuttle 16 includes a conventional hook shaped portion having a vacuum groove for securely retaining the wafer 14.

The load shuttle 16 is connected for reciprocation along a "loading" air bar 18 which is of conventional construction, i.e., a square tube 20 movable along and spaced from a bar 22 by means of air pressure. Each of the wafers 14 is transported in turn by the load shuttle 16 to a position designated 14a above a pre-aligner.

The pre-aligner, which is illustrated in FIG. 2, comprises a base member 24 from which a motor assembly 26 is suspended by a pair of leaf flexures 28a, 28b. The motor assembly 26 comprises a support housing 30 to which is secured a dc motor 32. The motor shaft 34 extends upwardly through bearings 36 to a spinner 38 which defines a vacuum chamber 40 connected by a channel 42 to a vacuum source 44. The vertical position of the motor assembly 26 is controlled by an air pot 46 and limit stops 48. The air pot 46 forces the motor assembly 26 upward so that the spinner 38 engages the underside of the wafer at 14a and vacuum is applied to chamber 40. The vacuum on load shuttle 16 releases and the load shuttle is retracted along the air bar 18 into its initial position to extract the next wafer. The motor assembly 26 is then retracted by the air pot 46 to the position indicated in FIG. 2.

Positioned above the edge of the wafer 14 is a detector array 50. This may be a commercially available detector such as the Fairchild CCD 143 comprising a linear array of light detecting elements. Positioned below the wafer and the array 50 is an illumination system 52 comprising a light source 54 and collimating lens 56. As will be apparent from FIG. 2, a portion of the light from the illuminating system 52 is blocked by the wafer 14 from reaching the detector array 50. If the center of the wafer 14 is exactly aligned with the axis of rotation of the spinner 38, the amount of light received by the detector array 50 remains constant throughout a revolution of the wafer (except for that passed by the notch or flat described below). If, however, the wafer is offset in X or Y (mutually orthogonal axes in the plane of the wafer), the output from the detector array 50 will be cyclically variable. This output is supplied to a central processing unit (CPU) 58 which is programmed to determine the X and Y offsets.

The manufacturers of semiconductor wafers incorporate some type of angular, or "$\Theta$" indicia on each wafer to indicate the direction of crystal growth. This is required because it is important for chip producers to properly position circuits in accordance with crystal orientation. The wafer shown in position 14a of FIG. 1 carries a small notch 60 as a $\Theta$ indicia. Flats are also widely used for this purpose. In any event, during the one rotation of the wafer 14, the $\Theta$ indicia will be readily noted by the presence of an extra light pulse at detector 50 which passes a resulting signal to the central processing unit 58. It is then a simple matter for the central processing unit 58 to command the motor 32 to stop with the $\Theta$ indicator in a desired predetermined position.

Figure 3:
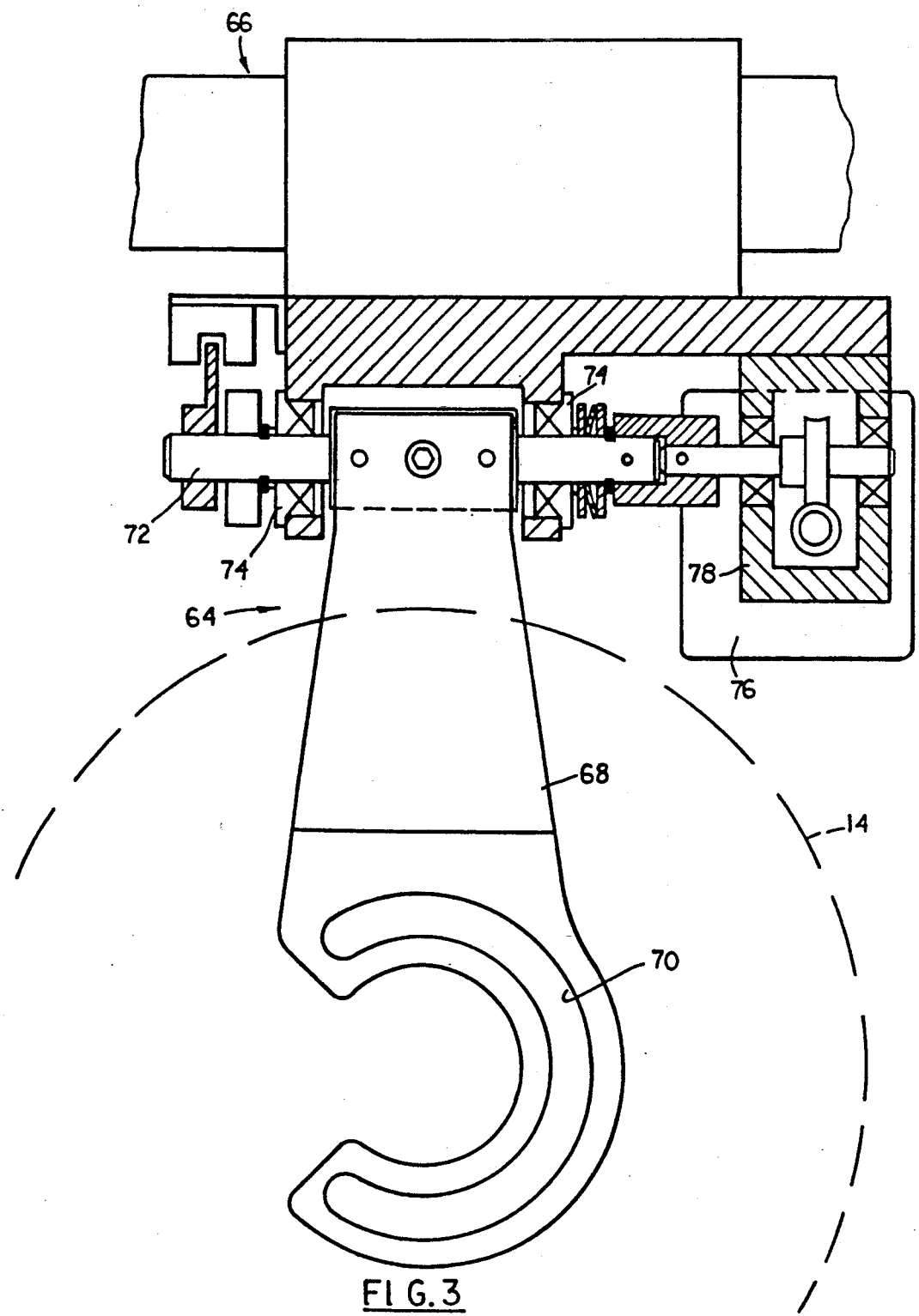
FIG. 3 is an enlarged detail, partially in cross-section, of the input shuttle of the invention.

The X and Y offsets computed by the central processing unit 58 are employed to pre-position a vacuum chuck 62 which forms a portion of a transport stage which will be employed to expose the wafer to a circuit pattern. Upon completion of pre-alignment, the spinner once again raises the wafer to the 14a position where it is engaged by an input shuttle 64 mounted for translation along the X direction on an air bar 66. As will be apparent from FIG. 3, the input shuttle assembly 64 includes a shuttle arm 68 having the usual C-shaped vacuum groove 70 for securely holding a wafer 14. It is mounted on a shaft 72 for 90° pivotal rotation on bearings 74 under control of a stepping motor 76 through gear box 78.

After acquiring the wafer 14, the input shuttle 68 moves in the X direction to the left as viewed in FIG. 1 and, at the same time, it is rotated downwardly through 90° to position the wafer 14 in a vertical plane in order that it may be acquired by the pre-positioned vacuum chuck 62 of the transport stage.

Figure 4:
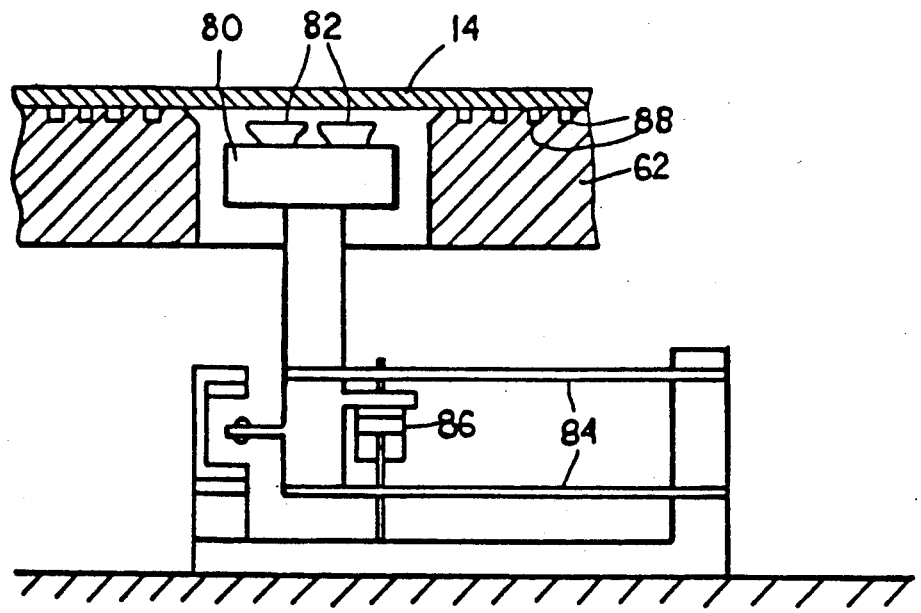
FIG. 4 is an elevational view of the wafer lifter of the invention with portions of the wafer and wafer chuck in cross-section.

Vacuum chuck 62 acquires the wafer by the mechanism shown in FIG. 4. This comprises a head 80 carrying rubber vacuum cups 82 mounted on flexures 84 under the control of an air pot 86. The air pot 86 forces the head 80 through the central opening in chuck 62 permitting the vacuum cups 82 to engage the wafer 14. The assembly is then retracted to place the wafer 14 on the vacuum chuck 62 where it is retained by the vacuum grooves 88. As explained above, the vacuum chuck 62 has been pre-positioned to compensate for the initial X and Y displacements seen by detector 50. This pre-positioning may be accomplished by means of a planar force motor such as those described, for example, in the following U.S. Pat. Nos.:

U.S. Pat. No. 4,485,339 of Trost for "Electro-Magnetic Alignment Device";

U.S. Pat. No. 4,506,205 of Trost and Galburt for "Electro-Magnetic Alignment Apparatus": and U.S. Pat. No. 4,507,597 of Trost for "Electro-Magnetic Alignment Assemblies".

The disclosures of the above-listed patents are incorporated herein by reference. Such motors provide very accurate control of rotational position. Accordingly, they are employed to make very fine adjustments in $\Theta$ as well as X and Y.

Figures 5, 6:
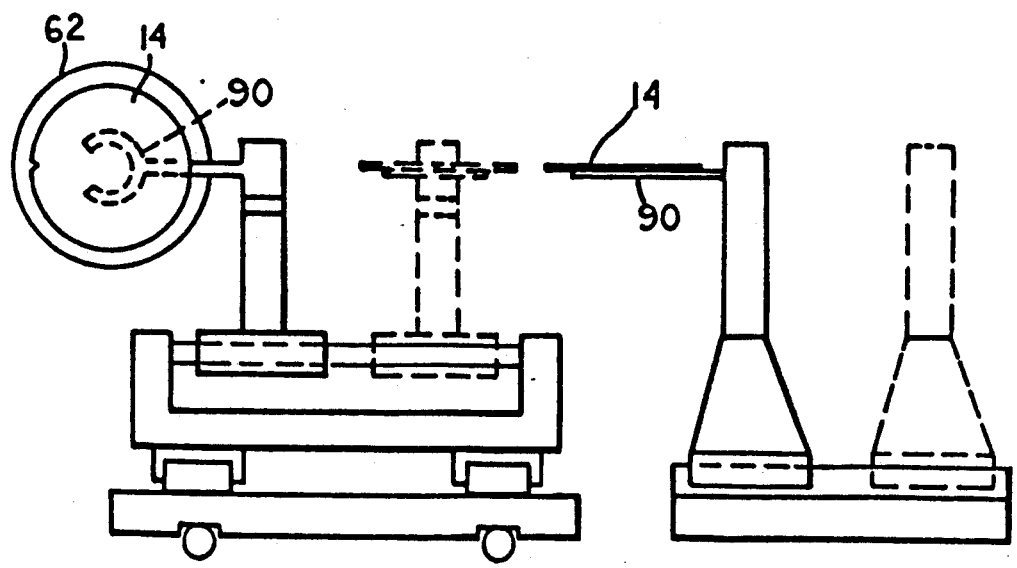
FIG. 5 is an elevation of the output shuttle of the invention.
FIG. 6 is a right end view of the shuttle of FIG. 5.

When the wafer 14 has been accurately positioned on the chuck 62 it is advanced to the exposure stage (which does not form a part of this invention). After exposure, the wafer is unloaded by the output shuttle assembly illustrated in FIGS. 5 and 6. The output shuttle 90 engages the wafer 14 as shown in FIG. 5 and is then retracted to the dotted line position. It also rotates the wafer 90° to a horizontal position from which it is inserted into the output cassette 92. As this cassette is located on a different level from that of the input cassette 12, it is illustrated in FIG. 1 by dotted lines.

It will be noted that the system described herein is fully automatic and requires operator assistance only for loading and unloading of the cassettes. It automatically and precisely orients each wafer prior to exposure. It will also be noted that a number of variations and modifications may be made in this invention without departing from its spirit and scope. Accordingly, the foregoing description is to be construed as illustrative only, rather than limiting. This invention is limited only by the scope of the following claims.

I claim:

1. A semiconductor wafer handling system for precisely positioning and orientating a wafer in a plane perpendicular to a starting position thereof comprising:
   a wafer cassette having a plurality of semiconductor wafers horizontally stacked therein;
   a load shuttle capable of moving in a horizontal plane in alignment with one of said plurality of wafers and having a vacuum groove whereby said one of said plurality of wafers can be attached to said load shuttle;
   a prealigner means, positioned within the range of motion of said load shuttle, for receiving said one of said plurality of wafers;
   detection means, associated with said prealigner, for determining X and Y offsets and angular orientation of said one of said plurality of wafers;
   a vacuum chuck capable of being prepositioned associated with said detection means; and
   an input shuttle capable of moving between said prealigner and said vacuum chuck and pivoting through 90 degrees whereby said one of said plurality of wafers is accurately positioned on said vacuum chuck in a plane perpendicular to the original horizontal plane.

2. A semiconductor wafer handling system as in claim 1 wherein said prealigner comprises:
   a spinner; and
   means, associated with said spinner, for raising and lowering said spinner whereby said spinner engages said one of said plurality of wafers supported by said load shuttle.

3. A semiconductor wafer handling system as in claim 2 wherein said detection means comprises:
   optical means, associated with said spinner, for detecting movement of an edge of said one of said plurality of wafers; and
   means, associated with said optical means and said spinner, for computing the X and Y offsets and the angular orientation of said one of said plurality of wafers.

4. A semiconductor wafer handling system as in claim 2 where said input shuttle comprises:
   an air bar;
   a base guide traveling over said air bar;
   an arm pivotally mounted on said base guide capable of pivoting through 90 degrees from said horizontal plane to the plane of said vacuum chuck; and
   a motor attached to said arm whereby said arm can be selectively positioned to either said horizontal plane or the plane of said vacuum chuck.

* * * * *